United States Patent
Takagi et al.

(10) Patent No.: US 6,291,133 B1
(45) Date of Patent: Sep. 18, 2001

(54) PHOTOSENSITIVE RESIN COMPOSITION AND FLEXOGRAPHIC RESIN PLATE

(75) Inventors: Toshiya Takagi; Toshimi Aoyama, both of Kanagawa; Koji Kahara; Nobuhiro Kobayashi, both of Osaka; Masatoshi Yoshida, Nara, all of (JP)

(73) Assignees: Tokyo Ohka Kogyo Co. Ltd., Kanagawa; Nippon Shokubai Co. Ltd., Osaka, both of (JP)

( * ) Notice: Subject to any disclaimer, the term of this patent is extended or adjusted under 35 U.S.C. 154(b) by 0 days.

(21) Appl. No.: 09/308,783

(22) PCT Filed: Nov. 4, 1998

(86) PCT No.: PCT/JP98/04969

§ 371 Date: May 25, 1999

§ 102(e) Date: May 25, 1999

(87) PCT Pub. No.: WO99/23532

PCT Pub. Date: May 14, 1999

(30) Foreign Application Priority Data

Nov. 5, 1997 (JP) .................................................. 9-319102

(51) Int. Cl.$^7$ ...................................................... G03F 7/028
(52) U.S. Cl. .......................... 430/284.1; 522/90; 522/96; 522/97
(58) Field of Search ........................... 430/284.1; 522/96, 522/97, 90

(56) References Cited

U.S. PATENT DOCUMENTS

| 3,960,572 | * | 6/1976 | Ibata et al. | 430/284.1 |
| 4,092,172 | * | 5/1978 | Higuchi | 96/115 P |
| 5,688,633 | * | 11/1997 | Leach | 430/284.1 |

FOREIGN PATENT DOCUMENTS

| 50-6403 | 1/1975 | (JP) . |
| 52-63984 | 5/1977 | (JP) . |
| 5-27435 | 2/1993 | (JP) . |
| 8-36263 | 2/1996 | (JP) . |
| 8-220737 | 8/1996 | (JP) . |
| 8-292570 | 11/1996 | (JP) . |
| 10-69851 | 3/1998 | (JP) . |

OTHER PUBLICATIONS

JP8–36263–A English translation as obtained by USPTO from Derwent Thomson Scientific pp. 2–43 through pp. 43–43. No translation of tables done. Date of translations Nov. 17, 2000. Noted incomplete translation by Examiner of record.*

Talei et al, 124:328509, Chemical Abstracts, ACS copyright, online, 9 pages with Registry number additions of 176597–69–6, 176531–88–7, 176531–87–6 and 176531–86–5, English abstract of JP 08–036263 dated Jul. 22, 1994.*

* cited by examiner

Primary Examiner—Cynthia Hamilton
(74) Attorney, Agent, or Firm—Fish & Richardson P.C.

(57) ABSTRACT

The present invention provides a photosensitive resin composition which comprises an urethane resin obtained by reacting (A) a carboxyl group-containing polymer having an acid value of 30 mg KOH/g or more and a glass transition temperature of 30° C. or more, (B) a compound having two isocyanate groups in one molecule, (C) a compound having two hydroxyl groups in one molecule and (D) a photopolymerizable unsaturated monomer having one hydroxyl group in one molecule, and a photopolymerization initiator, and a resin plate for flexography using the photosensitive resin composition, whereby the photosensitive resin composition having water developing properties, high in sensitivity and impact resilience, and excellent in water resistance, ink resistance and press life of a hardened portion forming a line pattern area of a printing plate material and the resin plate for flexography prepared by the use of the photosensitive resin composition can be provided.

14 Claims, No Drawings

PHOTOSENSITIVE RESIN COMPOSITION AND FLEXOGRAPHIC RESIN PLATE

TECHNICAL FIELD OF THE INVENTION

The present invention relates to a photosensitive resin composition, and more particularly to a photosensitive resin composition suitable for a plate for aqueous flexography and a resin plate for flexography using the photosensitive resin composition.

TECHNICAL BACKGROUND

Conventionally, thermoplastic elastomers having appropriate impact resilience or photosensitive resin compositions comprising photopolymerizable unsaturated monomers and photopolymerization initiators have been used as photosensitive resin compositions for forming photosensitive resin layers of photosensitive resin plates for flexography. As the above-mentioned thermoplastic elastomers, for example, styrenic resins such as styrene/isoprene/styrene and styrene/butadiene/styrene have been used. However, these thermoplastic elastomers are hydrophobic, so that they can not be extracted with water or aqueous solvents. Accordingly, chlorine series organic solvents such as chloroform, trichloroethane, trichloroethylene and tetrachloroethylene have been exclusively used. Such chlorine series organic solvents have no inflammability, are easy in handling and high in stability. However, they are highly toxic to the human body, which not only raises a problem with regard to hygiene, but also are unfavorable from the viewpoint of working environment.

For solving such a problem of the conventional photosensitive resin compositions, water-soluble photosensitive resin compositions containing polyvinyl alcohol or water-soluble nylon as a resin component have been proposed. However, they are low in impact resilience, so that they are unsuitable as materials for printing plates for printing thick printing materials such as corrugated fiberboards. Moreover, they have the disadvantage that water-color ink can not be used. Then, the present inventors have proposed a photosensitive resin composition comprising a resin obtained by reacting a carboxyl group-containing polymer having an acid value of 30 mg KOH/g or more and a glass transition temperature of 30° C. or more, a compound having two isocyanate groups in one molecule and a compound having two hydroxyl groups in one molecule as indispensable components, a photopolymerizable unsaturated monomer, and a photopolymerization initiator, as a photopolymerization initiator-containing photosensitive resin composition having water developing properties and excellent in impact resilience, in JP-A-8-36263 (the term "JP-A" as used herein means an "unexamined published Japanese patent publication"). The above-mentioned photosensitive resin composition has water developing properties and are excellent in impact resilience. However, it has the problems that a hardened portion forming a line pattern portion of a printing plate material is poor in water resistance, that the ink resistance is low, and moreover that the press life is also poor.

However, the photosensitive resin composition described in JP-A-8-36263 has excellent characteristics of water developing properties and high impact resilience which no conventional photosensitive resins have. Accordingly, based on the idea that an excellent photosensitive resin composition will be obtained by modifying the above-mentioned photosensitive resin composition described in JP-A-8-36263, the present inventors have made intensive studies. As a result, the inventors have discovered that a resin obtained by reacting a carboxyl group-containing polymer which has an acid value of 30 mg KOH/g or more and a glass transition temperature of 30° C. or more, a compound having two isocyanate groups in one molecule, a compound having two hydroxyl groups in one molecule and a photopolymerizable unsaturated monomer having one hydroxyl group in one molecule is effective as the resin component of the photosensitive resin composition, thus completing the present invention.

It is therefore an object of the present invention to provide a photosensitive resin composition having water developing properties and high sensitivity.

Furthermore, another object of the present invention is to provide a resin plate for flexography which has excellent impact resilience and is excellent in water resistance, ink resistance and press life of the line pattern area.

DISCLOSURE OF THE INVENTION

The invention which achieves the above objects is described below as items (1) to (11).

(1) A photosensitive resin composition comprising an urethane resin obtained by reacting (A) a carboxyl group-containing polymer having an acid value of 30 mg KOH/g or more and a glass transition temperature of 30° C. or more, (B) a compound having two isocyanate groups in one molecule, (C) a compound having two hydroxyl groups in one molecule and (D) a photopolymerizable unsaturated monomer having one hydroxyl group in one molecule, and a photopolymerization initiator.

(2) A photosensitive resin composition comprising an urethane resin obtained by reacting (A) a carboxyl group-containing polymer having an acid value of 30 mg KOH/g or more and a glass transition temperature of 30° C. or more, (B) a compound having two isocyanate groups in one molecule, (C) a compound having two hydroxyl groups in one molecule and (D) a photopolymerizable unsaturated monomer having one hydroxyl group in one molecule, and a photopolymerizable unsaturated monomer and a photopolymerization initiator.

(3) A photosensitive resin composition comprising an urethane resin comprising as structural units (A) a carboxyl group-containing polymer having an acid value of 30 mg KOH/g or more and a glass transition temperature of 30° C. or more, (B) a compound having two isocyanate groups in one molecule, (C) a compound having two hydroxyl groups in one molecule and (D) a photopolymerizable unsaturated monomer having one hydroxyl group in one molecule, and a photopolymerization initiator.

(4) The photosensitive resin composition according to any one of the above items (1) to (3), wherein the urethane resin is a resin obtained by reacting component (B), component (C), component (D) and component (A) in this order.

(5) The photosensitive resin composition according to any one of the above items (1) to (4), wherein component (A) is an acrylic polymer.

(6) The photosensitive resin composition according to any one of the above items (1) to (4), wherein component (B) is hexamethylene diisocyanate.

(7) The photosensitive resin composition according to any one of the above items (1) to (5), wherein component (C) is polyether diol.

(8) The photosensitive resin composition according to any one of the above items (1) to (4), wherein component (D) is a hydroxyl group-containing unsaturated acrylic acid ester series monomer.

(9) The photosensitive resin composition according to the above item (8), wherein the hydroxyl group-containing unsaturated acrylic acid ester series monomer is 2-hydroxyethyl acrylate.

(10) A resin plate for flexography using the photosensitive resin composition of any one of the above items (1) to (9).

(11) A resin plate for flexography, which uses the photosensitive resin composition of any one of the above items (1) to (9) and has a photosensitive resin layer having an impact resilience of 30% or more according to JIS K6301-11.

BESE MODE TO CARRY OUT THE INVENTION

The present invention will be described below in detail.

There is no particular limitation on component (A) used in the photosensitive resin composition of the present invention, as long as it is a carboxyl group-containing polymer having an acid value of 30 mg KOH/g or more and a glass transition temperature of 30° C. or more. There is also no particular limitation on a method for producing it, and it can be produced by any known method. Examples thereof include a method of copolymerizing a carboxyl group-containing monomer with an unsaturated monomer. Specific examples of the above-mentioned carboxyl group-containing monomers include acrylic acid, methacrylic acid, maleic acid, maleic monoester, fumaric acid, fumaric monoester, itaconic acid, itaconic monoester and cinnamic acid. The above-mentioned carboxyl group-containing monomers may be used either alone or as a combination of two or more of them.

The unsaturated monomers to be copolymerized with the above-mentioned carboxyl group-containing monomers include methacrylate monomers, aromatic vinyl monomers and other vinyl monomers copolymerizable with these monomers. The above-mentioned unsaturated monomers are suitably used because the use thereof elevates the glass transition temperature of component (A) to 30° C. or more. In particular, the use of the methacrylate monomers or the aromatic vinyl monomers alone is preferred, since a printing resin plate having high impact resilience can be obtained. Among them, the use of an acrylic polymer is preferred since the printing resin plate having high transparency as well as high impact resilience can be obtained. Specific examples of the above-mentioned methacrylate monomers include alkyl methacrylates such as methyl methacrylate, ethyl methacrylate, propyl methacrylate, isopropyl methacrylate, butyl methacrylate, cyclohexyl methacrylate, 2-ethylhexyl methacrylate, n-octyl methacrylate, dodecyl methacrylate and stearyl methacrylate; aryl methacrylates such as benzyl methacrylate; methacrylic acid substituent group-containing alkyl esters such as glycidyl methacrylate and methacrylic 2-amino esters; methacrylic acid derivatives such as methoxyethyl methacrylate and ethylene oxide adducts of methacrylic acid; fluorine-containing methacrylates such as perfluoromethyl methacrylate, perfluoroethyl methacrylate, perfluoropropyl methacrylate, perfluorobutyl methacrylate, perfluorooctyl methacrylate, 2-perfluoroethylethyl methacrylate, 2-perfluoromethyl-2-perfluoroethylmethyl methacrylate, triperfluoromethylmethyl methacrylate, 2-perfluoroethyl-2-perfluorobutylethyl methacrylate, 2-perfluorohexylethyl methacrylate, 2-perfluorodecylethyl methacrylate and 2-perfluorohexadecylethyl methacrylate, and hydroxyl group-containing addition polymerizable monomers such as 2-hydroxyethyl methacrylate, 2-hydroxypropyl methacrylate, 3-hydroxypropyl methacrylate, polyethylene glycol monomethacrylate, polypropylene glycol monomethacrylate and polycaprolactone-modified products of 2-hydroxyethyl methacrylate (trade name: Placcel F series, manufactured by Daicel Chemical Industries Ltd.). The above-mentioned methacrylate monomers may be used either alone or as a combination of two or more of them.

Further, there is no particular limitation on the aromatic vinyl monomers, and known aromatic vinyl monomers can be used. Specific examples thereof include styrene, α-methylstyrene, o-methylstyrene, m-methylstyrene, p-methylstyrene, chlorostyrene, styrenesulfonic acid and sodium styrenesulfonate. The above-mentioned aromatic vinyl monomers may be used either alone or as a combination of two or more of them.

In addition to the above-mentioned methacrylate monomers and aromatic vinyl monomers, the other vinyl monomers copolymerizable with the carboxyl group-containing monomers can also be used. Specifically, the other vinyl monomers include acrylic acid series monomers such as methyl acrylate, ethyl acrylate, n-butyl acrylate and 2-ethylhexyl acrylate; hydroxyl group-containing addition polymerizable monomers such as 2-hydroxyethyl acrylate, 2-hydroxypropyl acrylate, 3-hydroxypropyl acrylate, polyethylene glycol monoacrylate, polypropylene glycol monoacrylate and polycaprolactone-modified products of 2-hydroxyethyl acrylate (trade name: Placcel F series, manufactured by Daicel Chemical Industries Ltd.); hydroxyl group-containing addition polymerizable monomers such as (meth) allyl alcohol 4-hydroxymethylstyrene; maleic anhydride and dialkyl maleates; dialkyl fumarates; fluorine-containing vinyl monomers such as perfluoroethylene, perfluoropropylene and vinylidene fluoride; vinylalkyloxysilyl group-containing monomers such as vinyl trimethoxysilane and vinyltriethoxysilane; maleimide derivatives such as maleimide, methylmaleimide, ethylmaleimide, propylmaleimide, butylmaleimide, octylmaleimide, dodecylmaleimide, stearylmaleimide, phenylmaleimide and cyclohexylmaleimide; nitryl group-containing vinyl monomers such as acrylonitrile and methacrylonitrile; amido group-containing vinyl monomers such as acrylamide and methacrylamide; vinyl esters such as vinyl acetate, vinyl propionate, vinyl pivalate, vinyl benzoate and vinyl cinnamate; alkenes such as ethylene and propylene; dienes such as butadiene and isoprene; and vinyl chloride, vinylidene chloride and acrylchlorides. The above-mentioned other vinyl monomers can be used either alone or as a combination of two or more of them.

Further, component (A) is required to have an acid value of 30 mg KOH/g or more, 80 mg KOH/g or more, preferably 90 mg KOH/g or more, more preferably 100 mg KOH/g or more, most preferably 120 mg KOH/g or more, and 300 mg KOH/g or less. For giving such an acid value, acidic functional group-containing acidic monomers can also be used, as well as the above-mentioned carboxyl group-containing monomers. The above-mentioned acidic monomers include, for example, styrenesulfonic acid, 2-acrylamido-2-methylpropane-sulfonic acid, 2-methacrylamido-2-methylpropanesulfonic acid, 2-sulfoethyl methacrylate, 2-sulfoethyl acrylate, vinylsulfonic acid, acrylsulfonic acid and methacrylsulfonic acid. The above-mentioned acidic monomers may be used either alone or as a combination of two or more of them.

Component (A) used in the present invention can be produced by polymerizing the above-mentioned respective components by known polymerization methods such as radical polymerization, anionic polymerization and cationic polymerization. In particular, when the methacrylate monomers or the aromatic vinyl monomers are used as the unsaturated monomers to be copolymerized with the carboxyl group-containing monomers, radical polymerization or anionic polymerization is suitably employed. There is no particular limitation on radical polymerization initiators used in the above-mentioned radical polymerization, and examples of the radical polymerization initiator include organic peroxides such as isobutyl peroxide, cumyl peroxyneodecanoate, diisopropyl oxydicarbonate, di(n-propyl) peroxydicarbonate, di(2-ethoxyethyl)peroxydicarbonate, di(2-ethylhexyl)peroxydicarbonate, t-hexyl peroxyneodecanoate, t-butyl peroxyneodecanoate, t-hexyl peroxypivalate, t-butyl peroxypivalate, 3,5,5-trimethylhexanoyl peroxide, decanoyl peroxide, lauroyl peroxide, cumyl peroxyoctate, succinic acid peroxide, acetyl peroxide, t-butyl peroxy(2-ethylhexanate), m-toluoyl peroxide, benzoyl peroxide, t-butyl peroxy-isobutylate, 1,1-bis(t-butylperoxy)cyclohexane, t-butyl peroxymaleate, t-butyl peroxylaurate, cyclohexanone peroxide, t-butyl peroxyisopropylcarbonate, 2,5-dimethyl-2,5-di (benzoylperoxyhexane), t-butyl peroxyacetate, 2,2-bis(t-butylperoxy)butane, t-butyl peroxybenzoate, n-butyl 4,4-bis (t-butylperoxy)valerate, di-t-butyl peroxyisophthalate, methyl ethyl ketone peroxide, dicumyl peroxide, 2,5-dimethyl-2,5-di(t-butylperoxy)hexane, $\alpha,\alpha'$-bis(t-butylperoxy-m-isopropyl)benzene, t-butylcumyl peroxide, diisobutylbenzene hydroperoxide, di-t-butyl peroxide, p-menthane hydroperoxide, 2,5-dimethyl-2,5-di(t-butylperoxy)hexyne-3,1,1,3,3-tetramethylbutyl hydroperoxide, cumene hydroperoxide and t-butyl hydroperoxide; inorganic peroxides such as hydrogen peroxide, potassium persulfate, sodium persulfate and ammonium persulfate; azo compounds such as 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobisisobutylonitrile, 2,2'-azobis(2-methylbutylonitrile), 1,1'-azobis(cyclohexane-1-carbonitrile), 2-(carbamoylazo)isobutylonitrile, 2-phenylazo-4-methoxy-2,4-dimethylvaleronitrile, 2,2'-azobis(2-amidinopropane) dihydrochloride, 2,2'-azobis(N,N'-dimethyleneisobutylamidine), 2,2'-azobis[2-methyl-N-(2-hydroxyethyl)propionamide], 2,2'-azobis(isobutylamide) dihydrate, 4,4'-azobis(4-cyanopentanoic acid) and 2,2'-azobis(2-cyanopropanol); redox initiators such as hydrogen peroxide-Fe(II) salt, persulfate-sodium hydrogensulfite, cumene hydroperoxide-Fe(II) salt and benzoyl peroxide-dimethylaniline; and photosensitizers such as diacetyl, dibenzyl and acetophenone.

Examples of the polymerization methods include bulk polymerization, solution polymerization, suspension polymerization, emulsion polymerization and solid-phase polymerization. The monomer(s) as starting material(s) and the radical polymerization initiator may be placed together in a polymerization vessel, or polymerization may be conducted while supplying the respective components to the polymerization vessel at any time. Further, polymerization may be performed by a method of supplying the monomer(s) as starting material(s) and the radical polymerization initiator to the polymerization vessel, after a part of the solvent has previously been placed in the polymerization vessel.

Component (A) obtained by polymerizing the above-mentioned respective components is required to have a glass transition temperature of 30° C. or more, preferably from 60 to 180° C., more preferably 90° C. or more, most preferably from 100 to 150° C. If the glass transition temperature is lower than 30° C., the proportion of the hard segment portions of the resin is reduced, resulting in poor impact resilience.

As Component (A) of the present invention, an acrylic block polymer comprising two or more of block structures of hard segments and soft segments also can be preferably used. In this case, the above-described preferred range of the glass transition temperature is applicable. Specifically, it is preferred to use a block polymer in which the block structure attributable to the soft segment has a Tg of 30 ° C. or more from the standpoint of retaining the balance between the impact resilience and other physical properties. In this case, the hard segment preferably has a Tg of 30° C. or more, more preferably 60° C. or more, and most preferably 90° C. or more. The upper limit of the Tg is 150° C. The number average molecular weight of component (A) ranges generally from 1,000 to 150,000, preferably from 2,000 to 50,000, and more preferably from 10,000 to 30,000. If the number average molecular weight is less than 1,000, the proportion of water-soluble and alkali-soluble portions of the resin is reduced to deteriorate water developing properties, and the proportion of the hard segment portions of the resin is also reduced, resulting in poor impact resilience. On the other hand, if the number average molecular weight exceeds 150,000, the proportion of the hard segment portions of the resin becomes too large, resulting in poor impact resilience.

There is no particular limitation on component (B) used in the present invention, as long as it is an isocyanate compound. Specific examples thereof include aliphatic, alicyclic and aromatic diisocyanate compounds such as dimethylene diisocyanate, trimethylene diisocyanate, tetramethylene diisocyanate, pentamethylene diisocyanate, hexamethylene diisocyanate, heptamethylene diisocyanate, 2,2-dimethylpentane-1,5-diisocyanate, octamethylene diisocyanate, 2,5-dimethylhexane-1,6-diisocyanate, 2,2,4-trimethylpentane-1,5-diisocyanate, nonamethylene diisocyanate, 2,2,4-trimethylhexane diisocyanate, decamethylene diisocyanate, isophorone diisocyanate, 1,4-phenylene diisocyanate, 4,4-diisocyanate-3,3-dimethylphenyl, diphenyldimethane-4,4'-diisocyanate, tolylene diisocyanate, 4,4'-diphenylmethane diisocyanate and naphthalene-1,5-diisocyanate; and oligomers and polymers thereof. They can be used either alone or as a combination of two or more of them. Hexamethylene diisocyanate is preferable among others, because it gives photo-hardenability excellent in flexibility, impact resilience and press life.

There is no particular limitation on component (C) used in the present invention, as long as it has two hydroxyl groups in one molecule. However, it is preferable to have a hydrophilic group because water developing properties are improved. Specifically, the compounds used as component (C) include aliphatic diols such as ethylene glycol, diethylene glycol, triethylene glycol, propylene glycol, 1,3-propanediol, 1,3-butanediol, 1,4-butanediol, 1,5-heptanediol, 1,6-hexanediol, trimethylene glycol, dipropylene glycol, tripropylene glycol, neopentyl glycol, 2-methyl-2,4-pentanediol, 2-ethyl-1,3-hexanediol, 3-methyl-1,5-pentanediol and 1,8-octanediol; alicyclic diols such as cyclohexane-1,4-diol, 1,4-cyclohexane glycol and hydrogenated bisphenol A; aromatic diols such as xylylene glycol, 1,4-dihydroxyethyl benzene and ethylene oxide adducts of bisphenol A; sulfur atom-containing diols such as dithiodiethanol and thiodiethylene glycol; and oligomers and polymers thereof. Specific examples of the oligomers and polymers include polyether diols such as polyethylene glycol, polypropylene glycol, block polymers of polyethylene glycol and polypropylene glycol and polybutylene glycol; polyolefin diols such as Poltherm manufactured by Mitsubishi Chemical Corporation, hydrogenated polyisoprene having hydroxyl groups at both ends manufactured by Kuraray Co., Ltd. and Epol manufactured by Idemitsu Petrochemical Co., Ltd.; polybutadiene diols such as OH group-terminated HTBN manufactured by B. F. Goodrich Co.; polyester diols such as Kuraball manufactured by Kuraray Co., Ltd.; polycarbonate diols; polyurethane diols, polyorganosiloxane diols; and polyacrylic diols such as acrylic polymers having hydroxyl groups at both ends described in JP-A-5-262808. The polyether diols are suitable among others because they are excellent in flexibility and impact resilience. The above-mentioned compounds used as component (C) may be used either alone or as a combination of two or more of them.

The compound to be used as component (D) in the present invention is not limited as long as it is a photopolymerizable unsaturated monomer having one hydroxyl group in one molecule. Examples thereof include hydroxyl group-containing addition polymerizable monomers such as 2-hydroxyethyl (meth)acrylate, 2-hydroxypropyl (meth)acrylate, 3-hydroxypropyl (meth)acrylate, methyl 2-hydroxymethylacrylate, 4-hydroxybutyl (meth)acrylate, polyethylene glycol mono(meth)acrylate, polypropylene glycol mono(meth)acrylate, polycaprolactone-modified products of 2-hydroxyethyl (meth)acrylate (trade name: Placcel F series, manufactured by Daicel Chemical Industries Ltd.) and (meth)acrylic alcohol 4-hydroxymethylstyrene. The above-mentioned compounds used as component (D) may be used either alone or as a combination of two or more of them. 2-Hydroxyethyl acrylate is preferable among others because it is excellent in sensitivity.

Thus, the use of the photopolymerizable unsaturated monomer having one hydroxyl group in one molecule results in an urethane resin having a photopolymerizable double bond introduced into the structural portion formed by the reaction of components (B) and (C). Namely, component (D) reacts at least with the structural portion formed by the reaction of components (B) and (C), so that a photopolymerizable double bond is introduced into the structural portion to provide a good urethane resin.

The urethane resin used in the present invention is a resin having structural units obtained by the above-mentioned respective components (A) to (D). Preferably, component (D) is reacted with a product obtained by reacting component (B) with component (C), and then, component (A) is reacted with the resulting product, thereby obtaining the urethane resin. The use of this urethane resin provides a photosensitive resin composition excellent in ink resistance and press life. The compounding ratio of component (B) to component (C) is generally from 1.1 to 10.0, preferably from 1.1 to 5.0, and more preferably w from 1.2 to 2.5, in the equivalent ratio of the NCO group of component (B) to the hydroxyl group of component (C) (NCO group/hydroxyl group). The compound obtained by the above-mentioned reaction generally has a glass transition temperature of 0° C. or less, preferably −30° C. or less, more preferably −50° C., and is preferably water-soluble or hydrophilic. Catalysts may be used in the above-mentioned reaction. The catalysts include di-n-butyltin dilaurate, stannous octate, triethylenediamine, diethylenediamine, triethylamine, metal naphthenates and metal octylates such as lead octylate. Further, solvents may be used, and examples thereof include ketones such as acetone, methyl ethyl ketone, methyl isobutyl ketone and cyclohexanone; aromatic hydrocarbons such as toluene and xylene; hydrocarbon halides such as chlorobenzene, trichlene and perchlene; ethers such as tetrahydrofuran and dioxane; and esters such as cellosolve acetate, ethyl acetate and butyl acetate.

The compounding ratio of component (D) to the [(B)+(C)] product is preferably 0.25 to 1.95 mol of component (D) per mol of [(B)+(C)] product. Further, the ratio of the [(B)+(C)+(D)] product to component (A) is preferably 30 to 250 parts by weight per 100 parts by weight of component (A). The obtained urethane resin can be incorporated into the photosensitive resin composition of the present invention in an amount of from 40 to 99.9% by weight.

The photosensitive resin compositions further contain photopolymerization initiators. Specifically, the above-mentioned photopolymerization initiators include 1-hydroxycyclohexyl phenyl ketone, 2,2-dimethoxy-1,2-diphenylethane-1-one, 2-methyl-1-[4-(methylthio)phenyl]-2-morpholinopropane-1-one, 2-benzyl-2-dimethylamino-1-(4-morpholinophenyl)-butane-1-one, 2-hydroxy-2-methyl-1-phenylpropane-1-one, 2,4,6-trimethylbenzoyldiphenylphosphine oxide, 1-[4-(2-hydroxyethoxy)phenyl]-2-hydroxy-2-methyl-1-propane-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropane-1-one, 1-(4-dodecylphenyl)-2-hydroxy-2-methylpropane-1-one, 4-benzoyl-4'-methyl dimethylsulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylamino-benzoate, 2-isoamyl 4-dimethylaminobenzoate, 2,2-diethoxy-acetophenone, benzyl dimethyl ketal, benzyl-β-methoxyethyl acetal, 1-phenyl-1,2-propanedione-2-(o-ethoxycarbonyl)oxime, methyl o-benzoylbenzoate, bis(4-dimethylaminophenyl) ketone, 4,4'-bisdiethylaminobenzophenone, 4,4'-dichlorobenzophenone, benzyl, benzoin, benzoin methyl ether, benzoin ethyl ether, benzoin isopropyl ether, benzoin n-butyl ether, benzoin isobutyl ether, p-dimethylaminoacetophenone, p-tert-butyl-trichloroacetophenone, p-tert-butyl dichloroacetophenone, thioxanthone, 2-methylthioxanthone, 2-isopropylthioxanthone, dibenzosuberone, α,α-dichloro-4-phenoxyacetophenone and pentyl 4-dimethylaminobenzoate. The above-mentioned photopolymerization initiators can be used either alone or as a mixture of two or more of them. The above-mentioned photopolymerization initiator can be used in a conventionally added amount, but is generally used in an amount of 0.1 to 10% by weight based on the photosensitive resin composition.

For preventing film reduction and swelling in developing, it is preferred that the photosensitive resin compositions of the present invention contain photopolymerizable unsaturated monomers. The above-mentioned photopolymerizable unsaturated monomers include acrylic acid and salts thereof; alkyl (meth)acrylates such as methyl (meth)acrylate, ethyl (meth)acrylate, propyl (meth)acrylate, isopropyl (meth)acrylate, butyl (meth)acrylate, cyclohexyl (meth)acrylate, 2-ethylhexyl (meth)acrylate, n-octyl (meth)acrylate, dodecyl (meth)acrylate and stearyl (meth)acrylate; aryl (meth)acrylates such as benzyl (meth)acrylate; (meth)acrylic acid substituent group-containing alkyl esters such as glycidyl (meth)acrylate and (meth)acrylic 2-amino esters; (meth)acrylic acid derivatives such as methoxyethyl (meth)acrylate and ethylene oxide adducts of (meth)acrylic acid; fluorine-containing (meth)acrylates such as perfluoromethyl (meth)acrylate, perfluoroethyl (meth)acrylate, perfluoropropyl (meth)acrylate, perfluorobutyl (meth)acrylate, perfluorooctyl (meth)acrylate, 2-perfluoromethylmethyl (meth)acrylate, 2-perfluoromethyl-2-perfluoroethylmethyl (meth)acrylate, triperfluoromethylmethyl (meth)acrylate, 2-trifluoromethylethyl (meth)acrylate, diperfluoromethylmethyl (meth) acrylate, 2-perfluoroethylethyl (meth)acrylate, 2-perfluoroethyl-2-perfluorobutylethyl (meth)acrylate, 2-perfluoromethyl-2-perfluoroethylethyl (meth)acrylate, 2-perfluoroethyl-2-perfluorobutylethyl (meth)acrylate, 2-perfluorohexylethyl (meth)acrylate, 2-perfluorodecylethyl (meth)acrylate and 2-perfluorohexadecylethyl (meth) acrylate; silicon-containing (meth)acrylate monomers such as γ-(methacryloyloxypropyl)trimethoxysilane; maleic anhydride, maleic acid, salts of maleic acid, and monoalkyl esters and dialkyl esters of maleic acid; fumaric acid, and monoalkyl esters and dialkyl esters of fumaric acid; itaconic acid, and monoalkyl esters and dialkyl esters of itaconic acid; hydroxyl group-containing addition polymerizable monomers such as 2-hydroxyethyl (meth)acrylate, 2-hydroxypropyl (meth)acrylate, 3-hydroxypropyl (meth)-acrylate, methyl 2-hydroxymethylacrylate, tetramethylene glycol (meth)acrylate, polyethylene glycol mono(meth)-acrylate, polypropylene glycol mono(meth)acrylate, polycaprolactone-modified products of 2-hydroxyethyl (meth)acrylate (trade name: Placcel F series, manufactured by Daicel Chemical Industries Ltd.) and (meth)acrylic alcohol 4-hydroxymethylstyrene; aromatic vinyl monomers such as styrene, α-methylstyrene, o-methylstyrene, m-methylstyrene, p-methylstyrene, chlorostyrene, styrenesulfonic acid and sodium styrenesulfonate; maleimide derivatives such as maleimide, methylmaleimide, ethylmaleimide, propylmaleimide, butyl-maleimide, octylmaleimide, dodecylmaleimide, stearyl-maleimide, phenylmaleimide and cyclohexylmaleimide; nitrile-group containing vinyl monomers such as acrylonitrile and methacrylonitrile; amido group-containing vinyl monomers such as acrylamide, methacrylamide, methylenebis(meth) acrylamide, methylenebis(meth)acrylamide, 1,6-hexamethylenebis(meth)-acrylamide, diethylenetriaminetris (meth)acrylamide, N-(hydroxymethyl) (meth)acrylamide and N,N'-bis(β-hydroxyethyl)-(meth)acrylamide; and phenoxypolyethylene glycol (meth)-acrylate, ethylene glycol di(meth)acrylate, diethylene glycol di(meth)acrylate, diallyl itaconate, glycerol di (meth)-acrylate, glycerol tri(meth) acrylate, trimethylolpropane tri(meth)acrylate, pentaerythritol tri(meth)acrylate, glycerol polypropylene glycol tri (meth)acrylate, 1,3-propylene glycol di(meth)acrylate, 1,4-cyclohexanediol di(meth)acrylate, 1,2,4-butanetriol tri (meth)acrylate, glycerol polypropyreneglycol tri(meth) acrylate,1,4-benzenediol di(meth)acrylate, pentaerythritol tetra(meth)-acrylate, tetramethylene glycol di(meth) acrylate, 1,5-pentanediol di(meth)acrylate, 1,6-hexanediol di(meth)-acrylate, divinyl adipate, divinyl phthalate and acrylated or methacrylated urethane. The above-mentioned photopolymerizable unsaturated monomers can be used either alone or as a combination of two or more of them.

Water-soluble monomers and crosslinkable monomers are preferred among others. Examples of the above-mentioned water-soluble monomers include (meth)acrylic acid and salts thereof, polyethylene glycol mono(meth)acrylate, methyl 2-hydroxymethylacrylate, ethyl 2-hydroxymethylacrylate, butyl 2-hydroxymethylacrylate, and maleic acid and salts thereof. There is no particular limitation on the crosslinkable monomers, as long as they are monomers each having two or more double bonds in one molecule. The above-described photopolymerizable unsaturated monomer can be added in an amount of 0 to 50% by weight based on the photosensitive resin composition.

Further, the photosensitive resin compositions of the present invention can also contain dyes, pigments, polymerization inhibitors, antioxidants and photodeterioration inhibitors to improve their performance as needed.

The photosensitive resin compositions of the present invention can be dissolved in an organic solvent by known methods, together with various additional components, as needed, and formed in a film or tabular form, followed by removal of the solvent. Alternatively, the composition may be mixed by use of roll mixers, and then formed in a film or tabular form with hot presses, thereby forming a photosensitive resin layer for producing a flexo relief. For preventing desensitization or adhesion caused by atmospheric oxygen, surface of the photosensitive resin layer for producing a flexo relief is preferably coated with a water-soluble or alcohol-soluble resin comprising polyvinyl alcohol, cellulose derivatives, polyamides or polyimides in a thickness of 1 to 50 μm to form a coating.

The photosensitive resin layer obtained above is pressed on a film or sheet of a resin such as polyethylene terephthalate (hereinafter referred to as PET), polyethylene and polypropylene, or a plate composed of a metal such as iron, aluminum and copper, and previously exposed, if necessary. Then, the photosensitive resin layer is selectively irradiated with actinic rays through a negative mask to conduct image exposure, and the unexposed areas are washed out with a developing solution, followed by drying to produce a flexo plate for flexography having rubber elasticity. The above-mentioned image exposure is carried out by irradiation with a light source such as extra-high pressure mercury lamp and chemical lamp for about 2 to about 20 minutes. After exposure, development is executed. Examples of the developing solution include water; hydroxides of alkali metals such as lithium, sodium and potassium; carbonates; bicarbonates; phosphates; pyrophosphates; primary amines such as benzylamine and butylamine; secondary amines such as dimethylamine, dibenzylamine and diethanolamine; tertiary amines such as trimethylamine, triethylamine and triethanolamine; cyclic amines such as morpholine, piperazine and pyridine; polyamines such as ethylenediamine and hexamethylenediamine; ammonium hydroxides such as tetraethylammonium hydroxide, trimethylbenzylammonium hydroxide and trimethylphenylbenzyl-ammonium hydroxide, sulfonium hydroxides such as trimethyl-sulfonium hydroxide, diethylmethylsulfonium hydroxide and dimethylbenzylsulfonium hydroxide; and diluted aqueous solutions of corrin. The unexposed areas are removed by the above-mentioned development, and only exposed areas remain. As the developing methods with the developing solution, conventional methods such as brush development and spray development can be used.

The flexographic resin plate prepared by using the photosensitive resin composition has a photosensitive resin layer excellent water-developability and impact resilience. The sensitivity of the resin layer is rated as "good", when the resin layer has a value of 9 or more in terms of the number of the hardening steps of 21 step tablet manufactured by Kodak when light having a wavelength falling within the range of 300 to 400 nm is irradiated at 2000 mJ/cm$^2$. The resin layer preferably has a value of 11 or more, more preferably 13 or more, most preferably 14 or more. With respect to the impact resilience (as measured by a JIS impact resilience testing machine) which the resin layer of the resin plate of flexographic printing preferably has, the impact resilience of the resin layer is rated as "good", when the resin layer has an impact resilience of 30% or more. The resin layer preferably has an impact resilience of 32% or more, more preferably 34% or more, still preferably 40% or more, and most preferably 45% or more.

EXAMPLES

The present invention will be further illustrated in greater detail with reference to the following examples and comparative examples, which are, however, not to be construed as limiting the invention. The number average molecular weight used in the examples and comparative examples was determined from a calibration curve according to standard polystyrene by gel permeation chromatography (GPC).

Production Example 1

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 2.5 parts by weight of a methyl ethyl ketone solution containing 20 wt % of azobis-2-methylbutyronitrile was poured thereinto while blowing nitrogen gas therein. Subsequently, a previously prepared monomer mixture consisting of 5.1 parts by weight of acrylic acid, 54.8 parts by weight of methyl methacrylate and 40.1 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone solution containing 20 wt % of azobis-2-methylbutyronitrile was poured thereinto, and the resulting solution was stirred for 2 hours. Thus, the reaction was terminated, and then, the solution was cooled to obtain acrylic polymer A having a number average molecular weight of 49,000, an acid value of 39 mg KOH/g and a glass transition temperature of 38° C.

Production Example 2

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 6.25 parts by weight of a methyl ethyl ketone solution containing 20 wt % of azobis-2-methylbutyronitrile was poured thereinto while blowing nitrogen gas therein. Subsequently, a previously prepared monomer mixture consisting of 11.5 parts by weight of acrylic acid, 62.4 parts by weight of methyl methacrylate and 26.1 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone solution containing 20 wt % of azobis-2-methylbutyronitrile was poured thereinto, and the resulting solution was stirred for 2 hours. Thus, the reaction was terminated, and then, the solution was cooled to obtain acrylic polymer B having a number average molecular weight of 18,000, an acid value of 90 mg KOH/g and a glass transition temperature of 63° C.

Production Example 3

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 1 part by weight of a methyl ethyl ketone solution containing 20 wt % of azobis-2-methylbutyronitrile was poured thereinto while blowing nitrogen gas therein. Subsequently, a previously prepared monomer mixture consisting of 13.5 parts by weight of acrylic acid, 83.8 parts by weight of methyl methacrylate and 2.7 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone solution containing 20 wt % of azobis-2-methylbutyronitrile was poured thereinto, and the resulting solution was stirred for 2 hours. Thus, the reaction was terminated, and then, the solution was cooled to obtain acrylic polymer C having a number average molecular weight of 25,000, an acid value of 105 mg KOH/g and a glass transition temperature of 100° C.

Production Example 4

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 1 part by weigh of a methyl ethyl ketone solution containing 20 wt % of azobis-2-methylbutyronitrile was poured thereinto while blowing nitrogen gas therein. Subsequently, a previously prepared monomer mixture consisting of 11.5 parts by weight of acrylic acid, 62.4 parts by weight of methyl methacrylate and 26.1 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone solution containing 20 wt % of azobis-2-methylbutyronitrile was poured thereinto, and the resulting solution was stirred for 2 hours. Thus, the reaction was terminated, and then, the solution was cooled to obtain acrylic polymer D having a number average molecular weight of 120,000, an acid value of 92 mg KOH/g and a glass transition temperature of 61° C.

Production Example 5

In a four-neck flask equipped with a stirrer, a thermometer, a condenser, a dropping funnel and a nitrogen gas-introducing pipe, 100 parts by weight of methyl ethyl ketone, 88.6 parts by weight of methyl methacrylate and 19.4 parts by weight of acrylic acid were placed, and the temperature thereof was raised to 75° C. Subsequently, 50 wt % of a previously prepared initiator solution, i.e., a solution of 1 part by weight of pentaerythritol tetrakisthioglycolate and 0.3 part by weight of azobis-2-methylbutyronitrile in 6 parts by weight of methyl ethyl ketone, was poured thereinto to initiate the reaction. The temperature in the flask during the reaction was maintained at the reflux temperature of methyl ethyl ketone. Fifty minutes and 70 minutes after initiation of the reaction, a 25 wt % of the initiator solution each was added. At the time when it was confirmed that the conversion ratio of the monomers was 70% or more, a previously prepared solution of 62.6 parts by weight of ethyl methacrylate and 9.4 parts by weight of acrylic acid in 66 parts by weight of methyl ethyl ketone was added dropwise for 2 hours. After termination of dropping, the temperature was maintained at the same temperature for 2 hours. Then, 0.2 part by weight of azobis-2-methylbutyronitrile was added thereto, and stirring was continued for 2 hours. Subsequently, the resulting solution was cooled to obtain acrylic polymer E having a number average molecular weight of 20,000, an acid value of 125 mg KOH/g, glass transition temperatures of 30° C. (for the soft segment) and 95° C. (for the hard segment), and a hard component/soft component ratio of 6/4.

Comparative Production Example 1

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 6.25 parts by weight of a methyl ethyl ketone containing 20 wt % of azobis-2-methylbutyronitrile was poured thereinto while blowing nitrogen gas therein. Subsequently, a previously prepared monomer mixture consisting of 5.1 parts by weight of acrylic acid, 38.9 parts by weight of methyl methacrylate and 56 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone containing 20 wt % of azobis-2-methylbutyronitrile was poured thereinto, and the resulting solution was stirred for 2 hours. Thus, the reaction was terminated, and then, the solution was cooled to obtain acrylic polymer F having a number average molecular weight of 20,000, an acid value of 39 mg KOH/g and a glass transition temperature of 18° C.

Comparative Production Example 2

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 6.25 parts by weight of a methyl ethyl ketone solution containing 20 wt % of azobis-2-methylbutyronitrile was poured thereinto while blowing nitrogen gas therein. Subsequently, a previously prepared monomer mixture consisting of 2.6 parts by weight of acrylic acid, 71.3 parts by weight of methyl methacrylate and 26.1 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone solution containing 20 wt % of azobis-2-methylbutyronitrile was poured thereinto, and the resulting solution was stirred for 2 hours. Thus, the reaction was terminated, and then, the solution was cooled to obtain acrylic polymer G having a number average molecular weight of 18,000, an acid value of 19 mg KOH/g and a glass transition temperature of 63° C.

Comparative Production Example 3

In a four-neck flask equipped with a stirrer, a thermometer, a condenser, a dropping funnel and a nitrogen gas-introducing pipe, 100 parts by weight of methyl ethyl ketone was placed, and the temperature thereof was raised to 75° C. Then, 60 parts by weight of a methyl ethyl ketone containing 20 wt % of azobis-2-methylbutyronitrile was poured thereinto while blowing nitrogen gas therein. Subsequently, a previously prepared monomer mixture consisting of 11.5 parts by weight of acrylic acid, 62.4 parts by weight of methyl methacrylate and 26.1 parts by weight of ethyl acrylate was added dropwise for 2 hours. The temperature in the flask during dropping was maintained at the reflux temperature of methyl ethyl ketone. After termination of dropping, the temperature was maintained at the same temperature for 2 hours. Then, 5 parts by weight of a methyl ethyl ketone solution containing 20 wt % of azobis-2-methylbutyronitrile was poured thereinto, and the resulting solution was stirred for 2 hours. Thus, the reaction was terminated, and then, the solution was cooled to obtain acrylic polymer H having a number average molecular weight of 800, an acid value of 90 mg KOH/g and a glass transition temperature of 17° C.

Synthesis Example 1

In a four-neck flask equipped with a stirrer, an air-introducing pipe, a thermometer and a reflux condenser, 120 parts by weight of methyl ethyl ketone, 100 parts by weight of Pluronic L61 (trade name, manufactured by Asahi Denka Kogyo K. K.) (ethylene oxide-propylene oxide copolymer) and 20 parts by weight of Nippollan 980 (trade name, manufactured by Nippon Polyurethane Co., Ltd.) (polycarbonate diol) were placed, and the temperature thereof was raised to 60° C., followed by stirring to dissolve them. Then, the resulting solution was cooled to 40° C., and 14.1 parts by weight of hexamethylene diisocyanate and 0.05 part by weight of di-n-butyltin dilaurate were added while blowing air therein. After stirring for 30 minutes, the temperature was raised to 75° C., and the solution was stirred for 2.5 hours to conduct the reaction. Subsequently, 7.1 parts by weight of 2-hydroxyethyl acrylate and 0.05 part by weight of methylhydroquinone were added, followed by stirring for 2 hours to conduct the reaction. Then, the resulting solution was cooled to 40° C. to obtain polymer A.

Synthesis Example 2

In a four-neck flask equipped with a stirrer, an air-introducing pipe, a thermometer and a reflux condenser, 100 parts by weight of methyl ethyl ketone, 60 parts by weight of Pluronic L61 (trade name, manufactured by Asahi Denka Kogyo K. K.) (ethylene oxide-propylene oxide copolymer), 15 parts by weight of Nippollan 980 (trade name, manufactured by Nippon Polyurethane Co., Ltd.) (polycarbonate diol) and 25 parts by weight of P-2010 (trade name, manufactured by Kuraray Co., Ltd.) (polyester polyol) were placed, and mixed by stirring them at 40° C. for 30 minutes. Then, 13.4 parts by weight of hexamethylene diisocyanate and 0.05 part by weight of di-n-butyltin dilaurate were added while blowing air therein. After stirring for 30 minutes, the temperature was raised to 75° C., and the solution was stirred for 2.5 hours to conduct the reaction. Subsequently, 3.6 parts by weight of hexamethylene diisocyanate, 7.1 parts by weight of 2-hydroxyethyl acrylate and 0.05 part by weight of methylhydroquinone were added, followed by stirring for 2 hours to conduct the reaction. Then, the resulting solution was cooled to 40° C. to obtain polymer B.

Synthesis Example 3

Polymer C was obtained in the same manner as in Synthesis Example 1 except that 21 parts by weight of methylene-bis-(4-phenyl isocyanate) was used in place of 14.1 parts by weight of hexamethylene diisocyanate.

Comparative Synthesis Example 1

Polymer D was obtained in the same manner as in Synthesis Example 1 except that the reaction was conducted by stirring for 2.5 hours using 10.1 parts by weight of hexamethylene diisocyanate, followed by cooling to 40° C. without addition of 2-hydroxyethyl acrylate.

Comparative Synthesis Example 2

In a four-neck flask equipped with a stirrer, an air-introducing pipe, a thermometer and a reflux condenser, 50 parts by weight of methyl ethyl ketone, 14.2 parts by weight of hexamethylene diisocyanate, 15.6 parts by weight of 2-hydroxyethyl acrylate, 0.02 part by weight of di-n-butyltin dilaurate and 0.03 part by weight of methylhydroquinone were placed. After stirring for 30 minutes, the temperature was raised to 75° C., and the resulting solution was stirred for 2.5 hours to conduct the reaction. Then, the solution was cooled to 40° C. to obtain polymer E.

Example 1

In a four-neck flask equipped with a stirrer, an air-introducing pipe, a thermometer and a reflux condenser, 85.7 parts by weight of polymer A obtained in Synthesis Example 1 and 200 parts by weight of acrylic polymer A obtained in Production Example 1 were placed, and mixed by stirring them at 40° C. for 30 minutes while blowing air therein. Then, the temperature was raised to 75° C., and the resulting solution was stirred for 3 hours to conduct the reaction. After the reaction, 20 parts by weight of IRR213 (trade name, manufactured by Daicel UCB Co., Ltd.)(urethane acrylate), 2 parts by weight of 2-dimethoxy-1,2-diphenylethane-1-one and 0.05 part by weight of methylhydroquinone were added thereto, and mixed by stirring them to obtain a photosensitive resin solution. This solution was extruded to a thickness of 1.6 mm by means of a twin extruder, removing the solvent under reduced pressure, and the extruded sheet was laminated with a PET film provided with an adhesive layer and a PET film coated with polyvinyl alcohol, thereby obtaining a photosensitive resin plate.

The above-mentioned photosensitive resin plate was irradiated with an actinic ray to harden the photosensitive resin up to a depth of 0.6 mm from the side of the PET film provided with the adhesive layer by use of an FL-40BL chemical lamp (manufactured by Toshiba Corp.). Subsequently, the PET film on the opposite side was separated, and a negative film was adhered to the photosensitive resin under vacuum. Then, the photosensitive resin plate was irradiated for 10 minutes to perform exposure. After the exposure, the photosensitive resin plate was developed at 30° C. using a 2.38 wt % aqueous solution of tetramethylammonium hydroxide, dried at 60° C. for 15 minutes, and further postexposed for 5 minutes by use of a chemical lamp, thereby obtaining a flexographic resin plate. The prepress processing characteristics and the physical properties after hardening were examined. Using the resulting plate as the flexographic resin plate, printing was done on hard paper (aqueous ink used: DF-040 (red), DF-260 (black) and DF-140 (ultramarine) available from SAKATA CORPORATION), and the ink resistance and the press life were examined.

Results of the evaluation are shown in Table 1.

Example 2

A flexographic resin plate was prepared using a photosensitive resin plate obtained in the same manner as in Example 1 except that 171.4 parts by weight of polymer A obtained in Synthesis Example 1 and 211.4 parts by weight of acrylic polymer B obtained in Production Example 2 were used. Results of the evaluation therefor are shown in Table 1.

Example 3

A flexographic resin plate was prepared using a photosensitive resin plate obtained in the same manner as in Example 1 except that 257.1 parts by weight of polymer A obtained in Synthesis Example 1 and 206.2 parts by weight of acrylic polymer C obtained in Production Example 3 were used. Results of the evaluation therefor are shown in Table 1.

Example 4

A flexographic resin plate was prepared using a photosensitive resin plate obtained in the same manner as in Example 1 except that 210.7 parts by weight of polymer B obtained in Synthesis Example 2 and 206.2 parts by weight of acrylic polymer C obtained in Production Example 3 were used. Results of the evaluation therefor are shown in Table 1.

Example 5

A flexographic resin plate was prepared using a photosensitive resin plate obtained in the same manner as in Example 1 except that 264 parts by weight of polymer C obtained in Synthesis Example 3 and 206.2 parts by weight of acrylic polymer C obtained in Production Example 3 were used. Results of the evaluation therefor are shown in Table 1.

Example 6

A flexographic resin plate was prepared using a photosensitive resin plate obtained in the same manner as in Example 1 except that 171.4 parts by weight of polymer A obtained in Synthesis Example 1 and 206.2 parts by weight of acrylic polymer D obtained in Production Example 4 were used. Results of the evaluation therefor are shown in Table 1.

Example 7

A flexographic resin plate was prepared using a photosensitive resin plate obtained in the same manner as in Example 1 except that 257.1 parts by weight of polymer A obtained in Synthesis Example 1 and 193.4 parts by weight of acrylic polymer E obtained in Production Example 5 were used. Results of the evaluation therefor are shown in Table 1.

Comparative Example 1

A flexographic resin plate was prepared using a photosensitive resin plate obtained in the same manner as in Example 1 except that 211.4 parts by weight of acrylic polymer F obtained in Comparative Production Example 1 was used in place of acrylic polymer A. Results of the evaluation therefor are shown in Table 1.

Comparative Example 2

A flexographic resin plate was prepared using a photosensitive resin plate obtained in the same manner as in Example 1 except that 211.4 parts by weight of acrylic polymer G obtained in Comparative Production Example 2 was used in place of acrylic polymer A. Results of the evaluation therefor are shown in Table 1.

Comparative Example 3

A flexographic resin plate was prepared using a photosensitive resin plate obtained in the same manner as in Example 1 except that 259.7 parts by weight of acrylic polymer H obtained in Comparative Production Example 3 was used in place of acrylic polymer A. Results of the evaluation therefor are shown in Table 1.

Comparative Example 4

A flexographic resin plate was prepared using a photosensitive resin plate obtained in the same manner as in Example 1 except that 250.1 parts by weight of polymer D obtained in Comparative Synthesis Example 1 and 206.2 parts by weight of acrylic polymer C obtained in Production Example 3 were used. Results of the evaluation therefor are shown in Table 1.

Comparative Example 5

A flexographic resin plate was prepared using a photosensitive resin plate obtained in the same manner as in Example 1 except that 79.9 parts by weight of polymer E obtained in Comparative Synthesis Example 2 and 206.2 parts by weight of acrylic polymer C obtained in Production Example 3 were used, and the amount of IRR213 (trade name, manufactured by Daicel UCB Co., Ltd.) (urethane acrylate) added after the reaction was changed to 50 parts by weight. Results of the evaluation therefor are shown in Table 1.

Comparative Example 6

To the photosensitive resin solution obtained in Comparative Example 4, 7.1 parts by weight of 2-hydroxyethyl acrylate was further added. Using the resulting solution, a flexographic resin plate was prepared in the same manner as in Example 1. Results of the evaluation are shown in Table 1. In the flexographic resin plate prepared, 2-hydroxyethyl acrylate was not reacted, so that the performance thereof was insufficient.

TABLE 1

| | Developing Time (min) | Sensitivity | Impact Resilience (%) | Ink Resistance | Press Life | Total Evaluation |
|---|---|---|---|---|---|---|
| Example 1 | 20 | 9 | 32 | B | C | B |
| Example 2 | 18 | 11 | 36 | B | B | B |
| Example 3 | 13 | 13 | 41 | B | B | A |
| Example 4 | 15 | 14 | 45 | A | A | A |
| Example 5 | 13 | 13 | 30 | B | B | B |
| Example 6 | 25 | 12 | 34 | B | A | B |
| Example 7 | 13 | 13 | 47 | A | B | A |
| Comparative Example 1 | 20 | 9 | 18 | B | C | D |
| Comparative Example 2 | 30 | 8 | 29 | A | C | D |
| Comparative Example 3 | 25 | 8 | 13 | C | D | D |
| Comparative Example 4 | 13 | 6.5 | 33 | D | C | C |
| Comparative Example 5 | 10 | 7 | 10 or less | B | B | D |
| Comparative Example 6 | 13 | 7 | 31 | D | C | C |

In the table, the sensitivity is shown by the hardening step number of a 21-step tablet manufactured by Kodak Co. The impact resilience is measured by means of a JIS impact resilience testing machine (manufactured by Kabushiki Kaisya Kawashima Seisakusyo) according to JIS K 6301-11. The ink resistance is represented by the number of prints at which poor printing occurs by expansion, wherein "A" indicates 500,000 or more prints, "B" indicates 100,000 to less than 500,000 prints, "C" indicates 50,000 to less than 100,000 prints, and "D" indicates less than 50,000 prints. The press life is represented by the number of prints at which poor printing occurs by wear and shaving, wherein "A" indicates 500,000 or more prints, "B" indicates 200,000 to less than 500,000 prints, "C" indicates 50,000 to less than 200,000 prints, and "D" indicates less than 50,000 prints. In the total evaluation, "A" is evaluated as particularly highly practical, "B" as practical, "C" as usable, but practically having a problem, and "D" as unusable.

As apparent from Table 1 shown above, the photosensitive resin compositions of the present invention are high in sensitivity and impact resilience, and excellent in ink resistance and press life. In particular, the use of hexamethylene diisocyanate as the compound having two isocyanate groups in one molecule results in high impact resilience, as shown in Examples 1 to 4, 6 and 7. Further, the use of the polyether diol as the compound having two hydroxyl groups in one molecule increases flexibility and impact resilience. Furthermore, it can be inferred that the use of 2-hydroxyethyl acrylate as the photopolymerizable unsaturated monomer improves the sensitivity.

INDUSTRIAL APPLICATION FIELD

The photosensitive resin compositions of the present invention can be easily developed with water or a diluted alkaline aqueous solution, and moreover, are high in sensitivity and impact resilience. The printing plate materials prepared therefrom are excellent in ink resistance and press life, and excellent as a printing material for thick printing plate materials such as corrugated fiberboards

What is claimed is:

1. A photosensitive resin composition comprising an urethane resin obtained by reacting (A) a carboxyl group-containing polymer having an acid value of 36 mg KOH/g or more and a glass transition temperature of 30° C. or more, (B) a compound having two isocyanate groups in one molecule, (C) a compound having two hydroxyl groups in one molecule and (D) a photopolymerizable unsaturated monomer having one hydroxyl group in one molecule, and a photopolymerization initiator.

2. The photosensitive resin composition according to claim 1, wherein said urethane resin is a resin obtained by reacting component (B), component (C), component (D) and component (A) in this order.

3. The photosensitive resin composition according to claim 1, wherein component (A) is an acrylic polymer.

4. The photosensitive resin composition according to claim 1, wherein component (B) is hexamethylene diisocyanate.

5. The photosensitive resin composition according to claim 1, wherein component (C) is polyether diol.

6. The photosensitive resin composition according to claim 1, wherein component (D) is a hydroxyl group-containing unsaturated acrylic acid ester monomer.

7. The photosensitive resin composition according to claim 6, wherein the hydroxyl group-containing unsaturated acrylic acid ester monomer is 2-hydroxyethyl acrylate.

8. A photosensitive resin composition comprising an urethane resin obtained by reacting (A) a carboxyl group-containing polymer having an acid value of 30 mg KOH/g or more and a glass transition temperature of 30° C. or more, (B) a compound having two isocyanate groups in one molecule, (C) a compound having two hydroxyl groups in one molecule and (D) a photopolymerizable unsaturated monomer having one hydroxyl group in one molecule, a photopolymerizable unsaturated monomer and a photopolymerization initiator.

9. The photosensitive resin composition according to claim 8, wherein said urethane resin is a resin obtained by reacting component (B), component (C), component (D) and component (A) in this order.

10. The photosensitive resin composition according to claim 8, wherein component (A) is an acrylic polymer.

11. The photosensitive resin composition according to claim 8, wherein component (B) is hexamethylene diisocyanate.

12. The photosensitive resin composition according to claim 8, wherein component (C) is polyether diol.

13. The photosensitive resin composition according to claim 8, wherein component (D) is a hydroxyl group-containing unsaturated acrylic acid ester monomer.

14. The photosensitive resin composition according to claim 13, wherein the hydroxyl group-containing unsaturated acrylic acid ester series monomer is 2-hydroxyethyl acrylate.

* * * * *

UNITED STATES PATENT AND TRADEMARK OFFICE
CERTIFICATE OF CORRECTION

PATENT NO. : 6,291,133 B1
DATED : September 18, 2001
INVENTOR(S) : Nobuhiro Kobayashi, Toshimi Aoyama, Koji Kahara, Toshiya Takagi and Masatoshi Yoshida It is certified that error appears in the above-identified patent and that said Letters Patent is hereby corrected as shown below:

<u>Column 8,</u>
Line 28, please delete "36" and replace it with -- 30 --.
Lines 42-43, please delete "diisocy-ante" and replace it with -- diisocyanate --.

<u>Column 20,</u>
Line 3, please delete the word "series".

Signed and Sealed this

Ninth Day of July, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,291,133 B1
DATED : September 18, 2001
INVENTOR(S) : Nobuhiro Kobayashi et al.

It is certified that error appears in the above-identified patent and that said Letters Patent is hereby corrected as shown below:

Column 18,
Line 28, please delete "36" and replace it with -- 30 --.
Lines 42-43, please delete "diisocy-ante" and replace it with -- diisocyanate --.

Column 20,
Line 3, please delete the word "series".

This certificate supersedes Certificate of Correction issued July 9, 2002.

Signed and Sealed this

Twenty-fifth Day of March, 2003

JAMES E. ROGAN
*Director of the United States Patent and Trademark Office*